United States Patent
Lin et al.

(10) Patent No.: US 10,115,596 B2
(45) Date of Patent: Oct. 30, 2018

(54) METHOD OF FABRICATING A SEMICONDUCTOR DEVICE HAVING A T-SHAPE IN THE METAL GATE LINE-END

(71) Applicant: TAIWAN SEMICONDUCTOR MANUFACTURING CO., LTD., Hsinchu (TW)

(72) Inventors: Chien-Chih Lin, Hsinchu (TW); Chien-Hung Yeh, Hsinchu (TW); Guan-Jie Shen, Hsinchu (TW); Chia-Der Chang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/693,135

(22) Filed: Aug. 31, 2017

(65) Prior Publication Data
US 2018/0061977 A1 Mar. 1, 2018

Related U.S. Application Data

(62) Division of application No. 14/253,156, filed on Apr. 15, 2014, now Pat. No. 9,780,213.

(51) Int. Cl.
*H01L 21/336* (2006.01)
*H01L 21/28* (2006.01)
(Continued)

(52) U.S. Cl.
CPC ... *H01L 21/28114* (2013.01); *H01L 21/31111* (2013.01); *H01L 21/32133* (2013.01);
(Continued)

(58) Field of Classification Search
CPC ............... H01L 21/28114; H01L 29/78; H01L 29/66545; H01L 29/42356;
(Continued)

(56) References Cited

U.S. PATENT DOCUMENTS 8,264,048 B2 * 9/2012 Rachmady ........ H01L 21/28114
257/213
2005/0121703 A1 6/2005 Hieda et al.
(Continued)

FOREIGN PATENT DOCUMENTS

CN 1577850 A 2/2005

OTHER PUBLICATIONS

Office Action dated Aug. 2, 2017 issued in Chinese Patent Application No. 200410050127.0.
(Continued)

*Primary Examiner* — Shouxiang Hu
(74) *Attorney, Agent, or Firm* — McDermott Will & Emery LLP (57) ABSTRACT

A method of fabricating a metal gate structure in a semiconductor device is disclosed. The method comprises removing a dummy poly gate, removing IL oxide and STI using a dry etch process and a wet lateral etch process to form a T-shape void in the semiconductor device, and depositing metal gate material in the T-shape void to form a T-shape structure in a metal gate line-end. A semiconductor device fabricated from a process that included the removal of a dummy poly gate is disclosed. The semiconductor device comprises an OD fin and a metal gate fabricated above a section of the OD fin and adjacent to a side section of the OD fin. The metal gate has a T-shape structure in a metal gate line-end. The T-shape structure was formed by removing IL oxide and STI using a dry and a wet lateral etch process to form a T-shape void.

20 Claims, 5 Drawing Sheets

(51) Int. Cl.
*H01L 29/66* (2006.01)
*H01L 29/78* (2006.01)
*H01L 27/088* (2006.01)
*H01L 29/423* (2006.01)
*H01L 21/3213* (2006.01)
*H01L 21/311* (2006.01)

(52) U.S. Cl.
CPC .... *H01L 27/0886* (2013.01); *H01L 29/42356* (2013.01); *H01L 29/42376* (2013.01); *H01L 29/66545* (2013.01); *H01L 29/66795* (2013.01); *H01L 29/78* (2013.01); *H01L 29/785* (2013.01)

(58) Field of Classification Search
CPC ......... H01L 21/32133; H01L 21/31111; H01L 21/31116; H01L 29/42376; H01L 29/66795; H01L 29/785; H01L 29/42392; H01L 29/6681; H01L 21/823431; H01L 21/845; H01L 27/0886; H01L 27/10879; H01L 27/1211; H01L 27/10826
See application file for complete search history.

(56) References Cited

U.S. PATENT DOCUMENTS

| 2005/0224880 | A1 | 10/2005 | Lee et al. |
| 2006/0172497 | A1 | 8/2006 | Hareland et al. |
| 2010/0311213 | A1 | 12/2010 | Orlowski et al. |
| 2012/0256259 | A1 | 10/2012 | Surthi et al. |
| 2012/0313170 | A1* | 12/2012 | Chang ............... H01L 29/66545 257/347 |
| 2013/0302976 | A1 | 11/2013 | Tsai et al. |
| 2014/0239396 | A1* | 8/2014 | Liu ................... H01L 21/28008 257/347 |

OTHER PUBLICATIONS

Office Action dated Oct. 12, 2016 issued in Korean Patent Application No. 10-2015-0053385.

Notice of Allowance dated Jun. 1, 2017 issued in U.S. Appl. No. 14/253,156.

* cited by examiner

METHOD OF FABRICATING A SEMICONDUCTOR DEVICE HAVING A T-SHAPE IN THE METAL GATE LINE-END

CROSS REFERENCE TO RELATED APPLICATIONS

This application is a divisional of U.S. patent application Ser. No. 14/253,156 filed on Apr. 15, 2014, the entire contents of which applications are incorporated herein by reference.

BACKGROUND

The technology described in this patent document relates to metal-oxide semiconductor field-effect transistor (MOSFET) devices, and more specifically to MOSFET devices having a gate structure formed using a replacement gate process, as well as to methods to fabricate such devices.

Scaling of semiconductor devices, such as a MOSFET, has enabled continued improvement in speed, performance, density, and cost per unit function of integrated circuits over the past few decades. Improvements to the process for creating a metal gate can further the scaling of integrated circuits.

A MOSFET can be fabricated on a bulk semiconductor substrate (planar devices) or on a silicon-on-insulator (SOI) type of structure. In a replacement gate process a dummy gate structure can be formed from, for example, polysilicon (poly). After source-drain (S/D) processing is initiated or continued, the dummy gate structure is removed and replaced by an electrically conductive metal-containing gate stack that overlies a channel region between the S/D in the bulk semiconductor substrate or in the silicon layer of the SOI structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Planar transistors can be fabricated using a process involving fabricating an oxidation diffusion (OD) region for the transistor, fabricating a dummy poly gate for the transistor, fabricating the transistor's source and drain regions, and then fabricating the transistor's gate region using what can be termed as a replace poly gate (RPG) process. A RPG process involves removing the dummy poly gate and replacing the dummy poly gate with a metal gate. In a semiconductor fabrication process that utilizes a RPG process, transistor performance can be improved by forming a line end section of the metal gate into a T-shaped structure. This can allow the transistor to utilize a larger effective OD width with better gate controllability. This can result in improved transistor performance.

Figure 1:
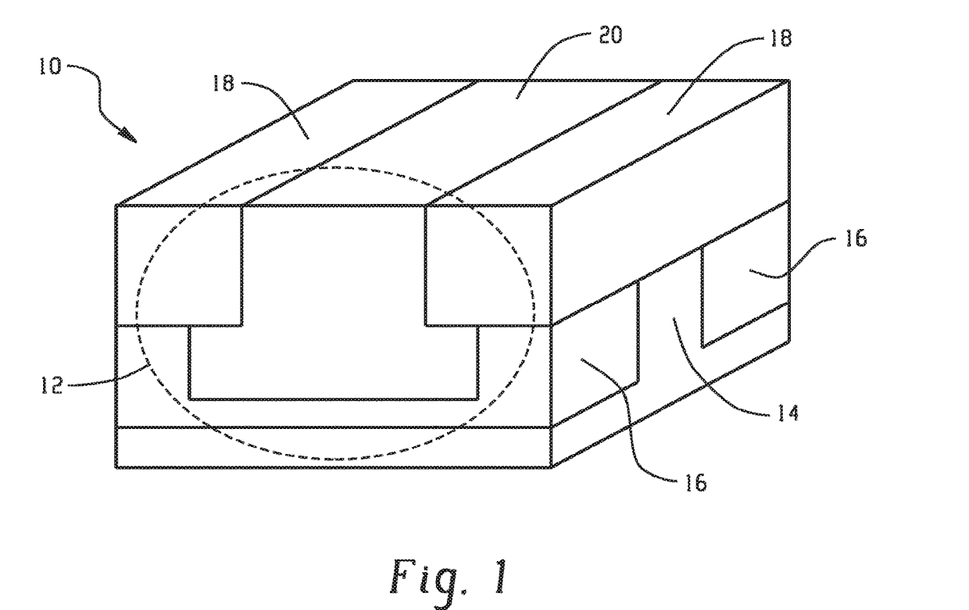
FIG. 1 is a cross-sectional view depicting an example semiconductor structure 10 having a T-shaped structure 12 in the metal gate line-end, in accordance with some embodiments.

FIG. 1 depicts an example semiconductor structure 10 having a T-shaped structure 12 in the metal gate line-end. The example semiconductor structure includes an OD region 14 with a raised fin, shallow trench isolation (STI) 16 material above portions of the OD region and surrounding the OD fin, and an interlayer dielectric (ILD) layer 18 above the STI 16 and OD fin 14. The example semiconductor structure further includes a metal gate 20 that includes a T-shaped structure 12 in the metal gate line-end.

Figure 2:
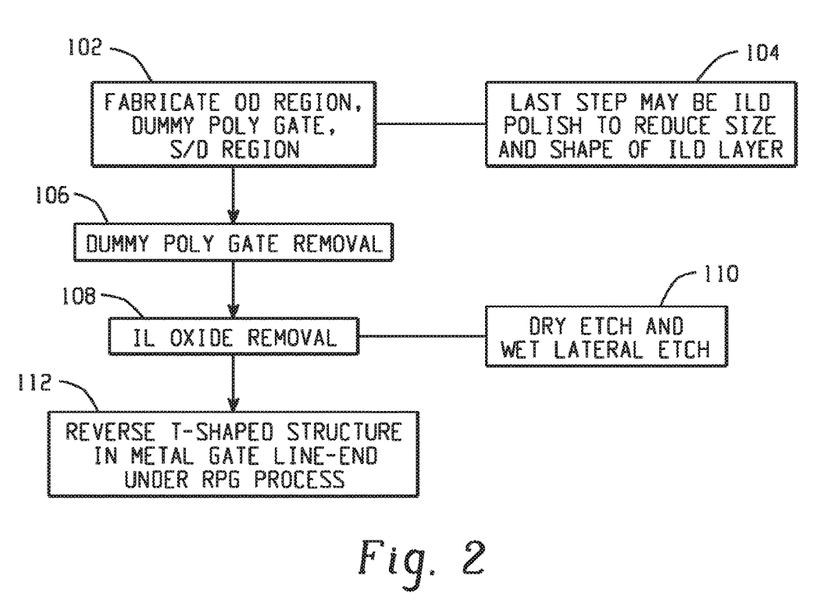
FIG. 2 is a process flow chart depicting an example process for fabricating a semiconductor structure having a T-shaped structure in the metal gate end, in accordance with some embodiments.

FIG. 2 is a process flow chart depicting an example process for fabricating a semiconductor structure having a T-shaped structure in the metal gate end. A semiconductor structure having an OD region with an OD fin, a dummy poly gate, a STI layer surrounding the OD fin, and a layer of ILD material above the OD fin and STI layer are fabricated first (operation 102). A final step of the fabrication operations may be to reduce the size and shape the poly gate and ILD layer using ILD polish operations (operation 104) such as chemical mechanical polishing (CMP) operations.

Next, dummy poly gate removal operations are performed (operation 106) to remove the dummy poly gate material. Dummy poly gate removal may be performed by operations such as etching and may result in the removal of the dummy poly gate material but leaving dummy interlayer (IL) oxide above the top surface of the OD fin.

After dummy poly gate removal operations are performed, dummy IL oxide removal operations (operation 108) take place. Dummy IL oxide removal operations in this example involve dry and wet etch operations (operation 110). The dry and wet etch operations may be performed to remove the dummy IL oxide residing above the top face of the OD fin, to remove STI under the area vacated by the dummy poly gate, and to remove STI under a portion of the ILD layer (e.g., with a lateral etch of 1 to 10 nm) and adjacent to a side face of the OD fin to form a T-shaped void in the semiconductor structure. In some examples, the wet etch operations follow the dry etch operations.

After dummy IL oxide removal, metal gate material including Hi-K dielectric material can be deposited (operation 112) in the area vacated by the dummy poly gate removal and IL oxide removal operations. The metal gate material can be deposited and polished to form a T-shaped structure in the metal gate line-end.

Figure 3:
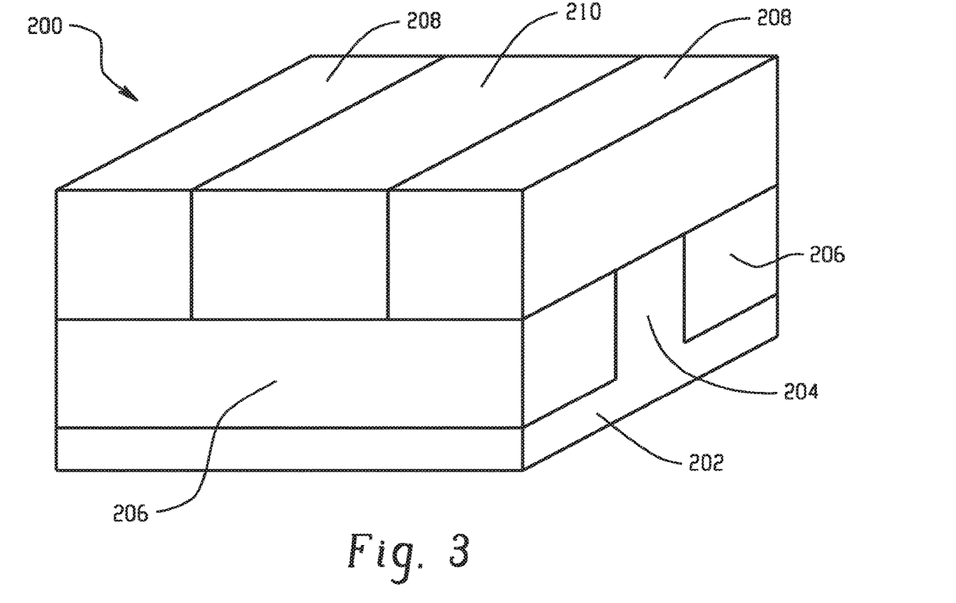
FIG. 3 depicts a cross-sectional view of an example semiconductor during different stages of fabrication of a transistor with a metal gate having a T-shaped structure in the metal gate line-end, in accordance with some embodiments.

FIGS. 3-6, depict cross-sectional views of an example semiconductor during different stages of fabrication of a transistor with a metal gate having a T-shaped structure in the metal gate line-end. Depicted in FIG. 3 is an example semiconductor device fabricated with an OD region 202 with a raised fin 204, shallow trench isolation (STI) 206 material above portions of the OD region 202 and surrounding the OD fin 204, and an ILD layer 208 above the STI 206 and OD fin 204. The example semiconductor structure further includes a dummy poly gate 210.

Figure 4:
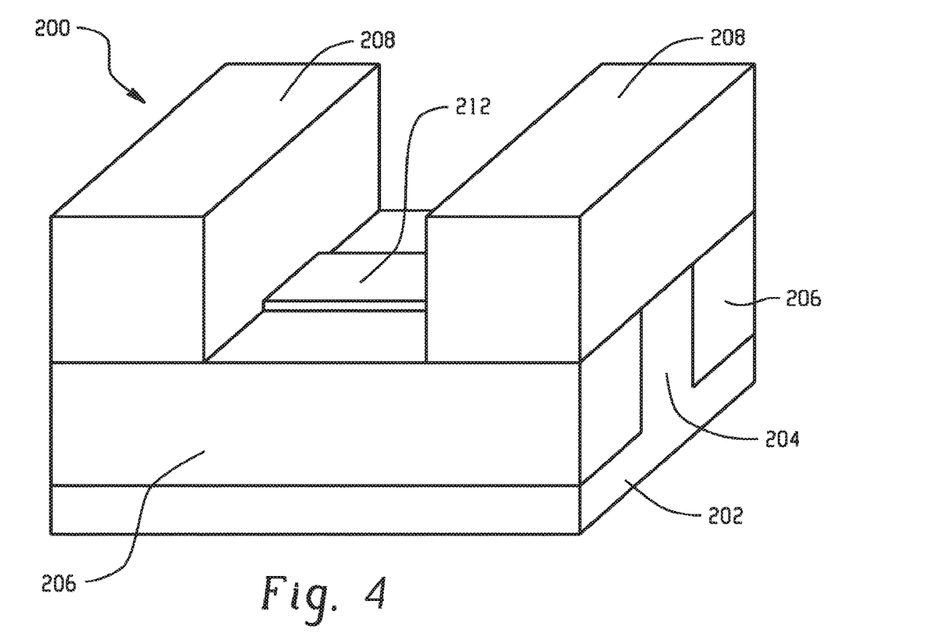
FIG. 4 depicts a cross-sectional view of an example semiconductor during different stages of fabrication of a transistor with a metal gate having a T-shaped structure in the metal gate line-end, in accordance with some embodiments.

Depicted in FIG. 4, is the example semiconductor device after the dummy poly gate has been removed. Shown is dummy IL gate oxide 212 above a top face of the OD fin 204.

Figure 5:
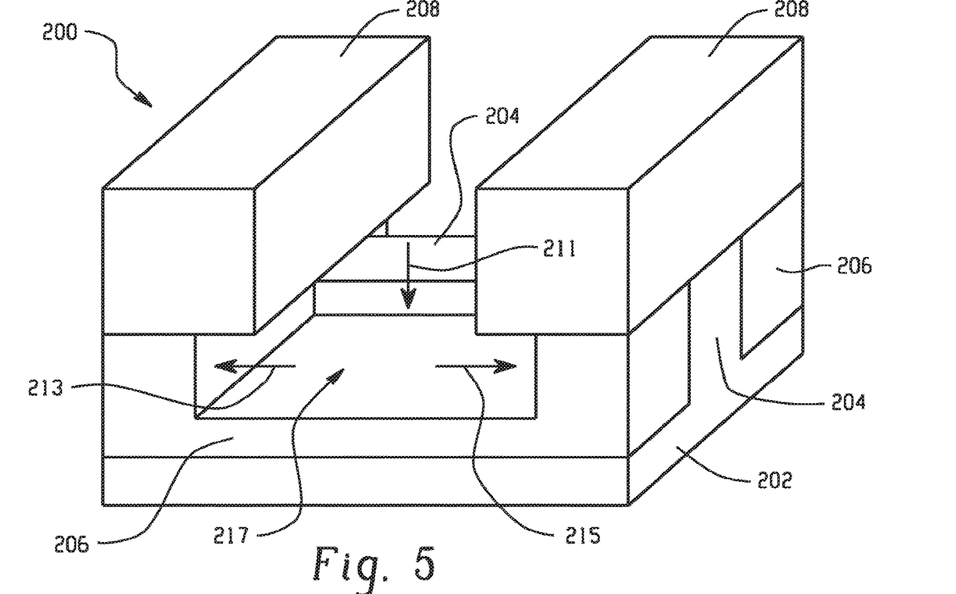
FIG. 5 depicts a cross-sectional view of an example semiconductor during different stages of fabrication of a transistor with a metal gate having a T-shaped structure in the metal gate line-end, in accordance with some embodiments.

Depicted in FIG. 5, is the example semiconductor device after dry and wet etch operations have been performed. The dry etch and wet etch operations are performed to remove the dummy IL gate oxide 212, to remove STI 206 under the area vacated by the dummy poly gate (as identified by the downward point arrow 211), and to remove STI 206 under the ILD layer 20S (as identified by the lateral arrows 213, 215) and adjacent to a side face of the OD fin to form a T-shaped void 217 in the semiconductor structure. In this example, a lateral etch of 1 to 10 nm is achieved.

Figure 6:
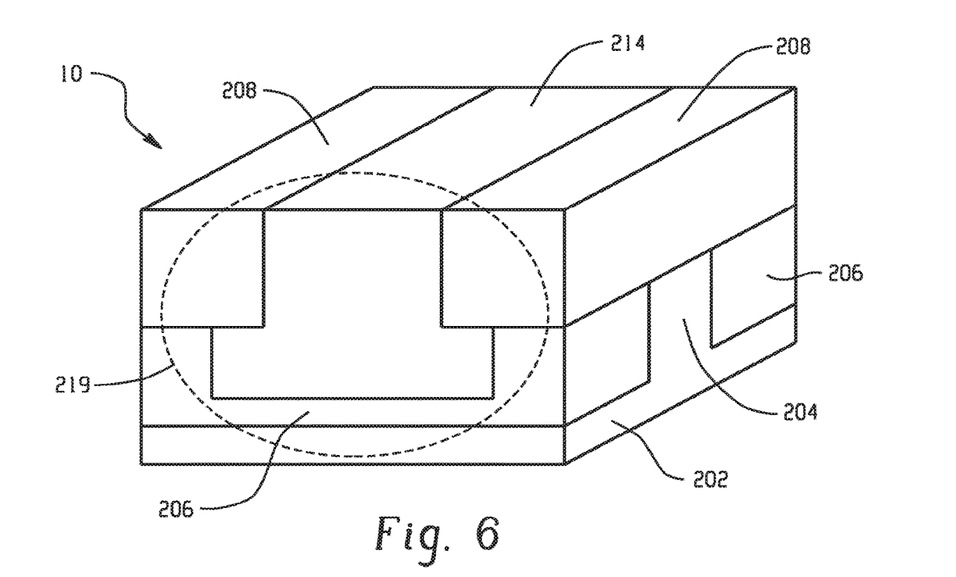
FIG. 6 depicts a cross-sectional view of an example semiconductor during different stages of fabrication of a transistor with a metal gate having a T-shaped structure in the metal gate line-end, in accordance with some embodiments.

Depicted in FIG. 6, is the example semiconductor device after metal gate deposition and polishing. Shown are an OD region 202 with a raised fin 204, STI 206, an ILD layer 20S, and a metal gate 214 with a T-shaped structure (as identified by the oval 219) in the metal gate line-end.

Figure 7A:
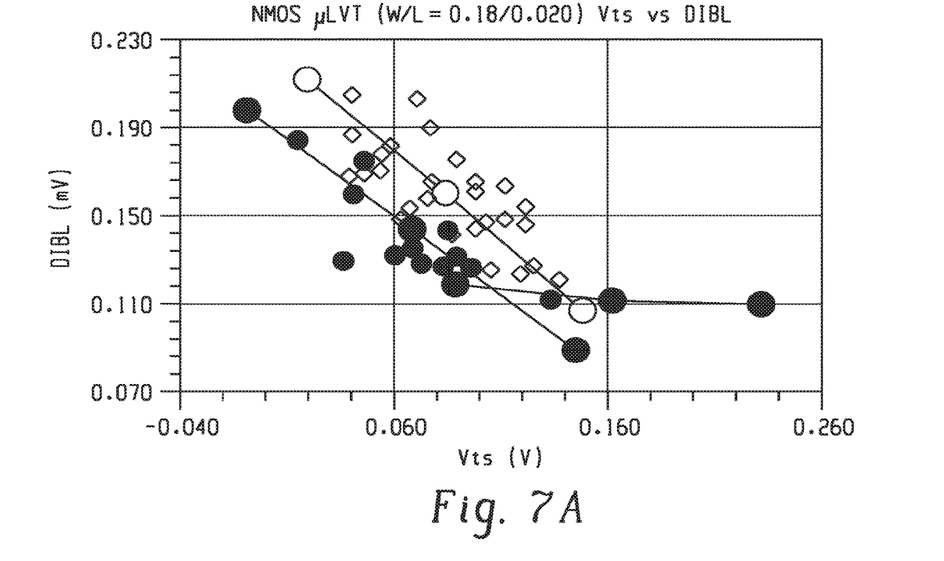
FIG. 7A is a plot illustrating the predicted drain-induced barrier lowering (DIBL) versus threshold voltage (Vts) for NMOS and PMOS transistors, in accordance with some embodiments.
Figure 7B:
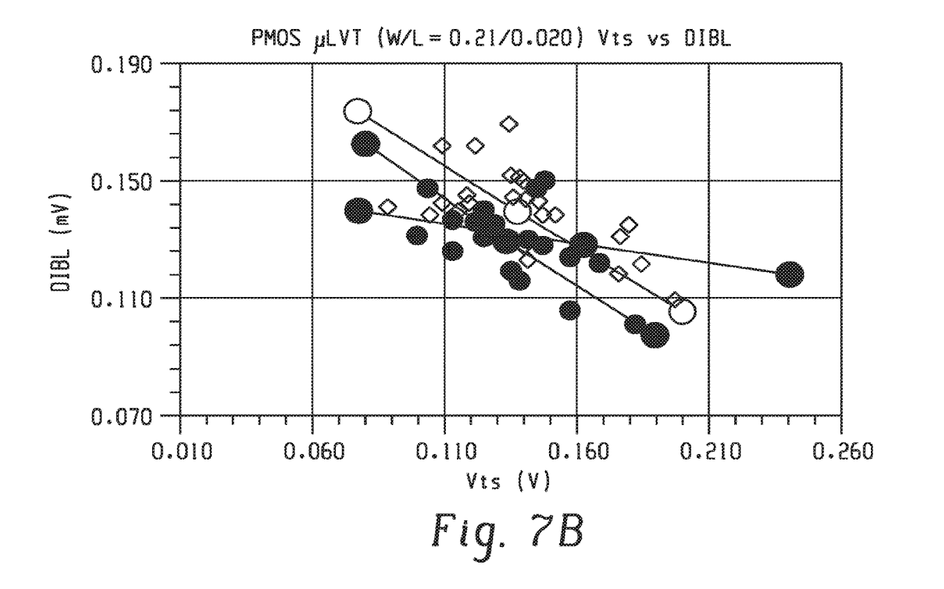
FIG. 7B is a plot illustrating the predicted drain-induced barrier lowering (DIBL) versus threshold voltage (Vts) for NMOS and PMOS transistors, in accordance with some embodiments.

FIGS. 7A and 7B are plots illustrating the predicted drain-induced barrier lowering (DIBL) versus threshold voltage (Vts) for NMOS and PMOS transistors with the width to length (W/L) ratios specified in the charts. FIG. 7A pertains to NMOS transistors and FIG. 7B pertains to PMOS transistors. These figures show that the transistors utilizing T-shaped gate structures (indicated by the square symbols) have improved DIBL performance versus the transistors that do not utilize T-shaped gate structures (indicated by the circular symbols).

Figure 8A:
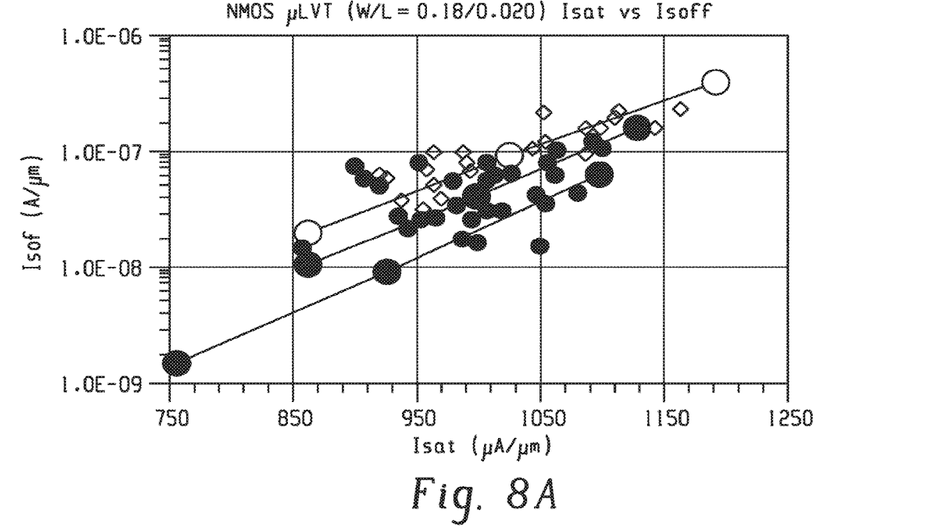
FIG. 8A is a plot illustrating the predicted off source current (Isof) versus saturation current (Isat) for NMOS and PMOS transistors, in accordance with some embodiments.
Figure 8B:
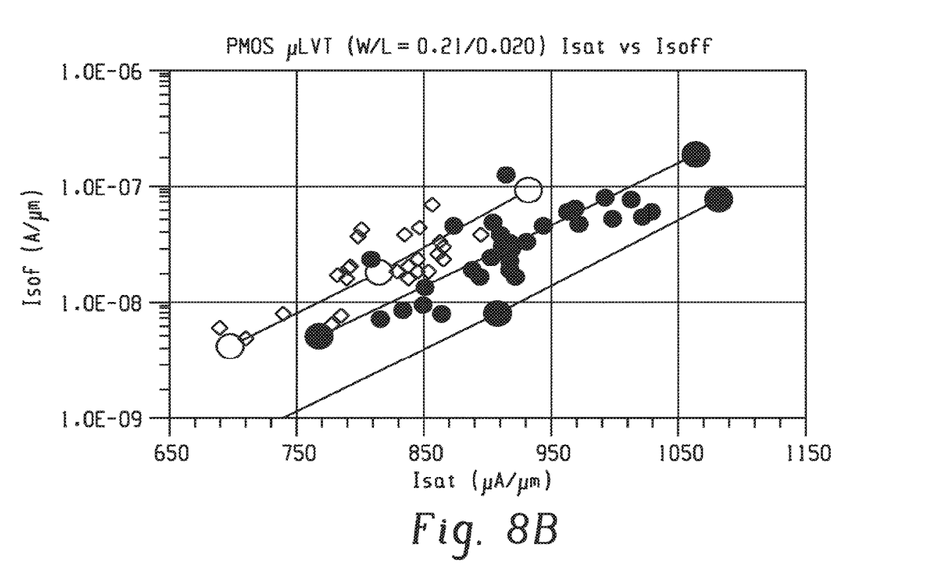
FIG. 8B is a plot illustrating the predicted off source current (Isof) versus saturation current (Isat) for NMOS and PMOS transistors, in accordance with some embodiments.

Figures SA and SB are plots illustrating the predicted off source current (Isof) versus saturation current (Isat) for NMOS and PMOS transistors with the width to length (W/L) ratios specified in the charts. Figure SA pertains to NMOS transistors and figure SB pertains to PMOS transistors. These figures show that the transistors utilizing T-shaped gate structures (indicated by the square symbols) have improved Isof performance versus the transistors that do not utilize T-shaped gate structures (indicated by the circular symbols).

Planar transistors without a T-shaped structure in the metal gate line-end may have a less effective OD width and weaker gate control ability compared with transistors having a T-shaped structure in the metal gate line-end. By applying approaches described herein, transistors having a T-shaped structure in the metal gate line-end may be fabricated using a RPG process.

The examples disclosed herein illustrate approaches for obtaining larger effective OD width and better gate control ability and, resultantly, better device performance such as improved DIBL and Ion-Isof performance. The wet and dry etches allow for a lateral etch of 1 to 10 nm to be achieved and a T-shaped gate structure in the metal gate line-end.

In one embodiment, disclosed is a method of fabricating a metal gate structure in a semiconductor device. The method comprises removing a dummy poly gate, removing IL oxide and STI using a dry etch process and a wet lateral etch process to form a T-shape void in the semiconductor device, and depositing metal gate material in the T-shape void to form a T-shape structure in a metal gate line-end.

These aspects and other embodiments may include one or more of the following features. The dry and wet lateral etch processes result in a lateral etch of 1 to 10 nm. Removing a dummy poly gate results in IL oxide remaining above an OD section. Removing IL oxide and STI results in IL oxide removal on a top face of the OD section and STI removal adjacent to a side face of the OD section. Removing IL oxide and STI results in STI removal below a section of an ILD layer. The DIBL performance is higher than that of a semiconductor device formed without a T-shape structure in the metal gate line-end. The Isof performance is higher than that of a semiconductor device formed without a T-shape structure in the metal gate line-end.

In another embodiment, disclosed is a method of fabricating a transistor. The method comprises fabricating a semiconductor structure comprising an OD region with a raised fin, STI on sides of the raised fin, IL oxide above the fin, a dummy poly gate across the fin, and an ILD layer on sides of the dummy poly gate. The method further comprises polishing the ILD layer and dummy poly gate to reduce the height thereof, removing the dummy poly gate, removing the IL oxide and a portion of the STI to form a T-shape void in the semiconductor structure, and depositing metal gate material in the T-shape void to form a T-shape structure in a metal gate line-end.

These aspects and other embodiments may include one or more of the following features. Removing IL oxide and STI is accomplished using a dry etch process and a wet lateral etch process. Performance of the dry and wet lateral etch processes result in a lateral etch of 1 to 10 nm. Removing IL oxide and STI results in IL oxide removal on a top face of the OD section and STI removal adjacent to a side face of the OD section. Removing IL oxide and STI results in STI removal below a section of the ILD layer. The DIBL performance is higher than that of a transistor formed without a T-shape structure in the metal gate line-end. The Isof performance is higher than that of a transistor formed without a T-shape structure in the metal gate line-end.

In another embodiment, a semiconductor device fabricated from a process that included the removal of a dummy poly gate is disclosed. The semiconductor device comprises an OD fin and a metal gate fabricated above a section of the OD fin and adjacent to a side section of the OD fin. The metal gate has a T-shape structure in a metal gate line-end. The T-shape structure was formed by removing IL oxide and STI using a dry etch process and a wet lateral etch process to form a T-shape void.

These aspects and other embodiments may include one or more of the following features. The dry and wet lateral etch processes resulted in a lateral etch of 1 to 10 nm. The application of said wet lateral etch process resulted in STI removal adjacent to said side section of the OD fin. The application of said dry etch process and said wet lateral etch process resulted in STI removal below a section of an ILD layer. The DIBL performance is higher than that of a similar transistor formed without a T-shape structure in the metal gate line-end. The Isof performance is higher than that of a similar transistor formed without a T-shape structure in the metal gate line-end.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a metal gate structure in a semiconductor device, the method comprising:
    removing a dummy poly gate;
    removing interlayer (IL) oxide and shallow trench isolation (STI) using a dry etch process and a wet lateral etch process to form a reversed T-shape void in the semiconductor device; and
    depositing metal gate material in the reversed T-shape void to form a reversed T-shape structure in a metal gate line-end.

2. The method of claim 1, wherein the dry and wet lateral etch processes result in a lateral etch of 1 to 10 nm.

3. The method of claim 1, wherein the removing a dummy poly gate results in IL oxide remaining above an oxidation diffusion (OD) section.

4. The method of claim 1, wherein the removing IL oxide and STI results in IL oxide removal on a top face of the oxidation diffusion (OD) section and STI removal adjacent to a side face of the OD section.

5. The method of claim 1, wherein the removing IL oxide and STI results in STI removal below a section of an interlayer dielectric (ILD) layer.

6. The method of claim 1, wherein the drain-induced barrier lowering (DIBL) performance is higher than that of a semiconductor device formed without the reversed T-shape structure in the metal gate line-end.

7. The method of claim 1, wherein the off source current (Isof) performance is higher than that of a semiconductor device formed without the reversed T-shape structure in the metal gate line-end.

8. A method of fabricating a transistor:
    fabricating a semiconductor structure comprising an oxidation diffusion (OD) region with a raised fin, shallow trench isolation (STI) on sides of the raised fin, interlayer (IL) oxide above the raised fin, a dummy poly gate across the raised fin, and an interlayer dielectric (ILD) layer on sides of the dummy poly gate;
    polishing the ILD layer and dummy poly gate to reduce the height thereof;
    removing the dummy poly gate;
    removing the IL oxide and a portion of the STI to form a reversed T-shape void in the semiconductor structure; and
    depositing metal gate material in the reversed T-shape void to form a reversed T-shape structure in a metal gate line-end.

9. The method of claim 8, wherein the removing IL oxide and STI is accomplished using a dry etch process and a wet lateral etch process.

10. The method of claim 9, wherein performance of the dry and wet lateral etch processes results in a lateral etch of 1 to 10 nm.

11. The method of claim 8, wherein the removing IL oxide and STI results in IL oxide removal on a top face of the OD section and STI removal adjacent to a side face of the OD section.

12. The method of claim 8, wherein the removing IL oxide and STI results in STI removal below a section of the ILD layer.

13. The method of claim 8, wherein the drain-induced barrier lowering (DIBL) performance is higher than that of a transistor formed without the reversed T-shape structure in the metal gate line-end.

14. The method of claim 8, wherein the off source current (Isof) performance is higher than that of a transistor formed without the reversed T-shape structure in the metal gate line-end.

15. A method of fabricating a transistor:
    fabricating a semiconductor structure comprising a raised fin, a dummy oxide layer covering at least a top of the raised fin, a first insulating layer covering sides of the raised fin, a dummy gate disposed over the raised fin, and a second insulating layer disposed over the first insulating layer and on sides of the dummy gate;
    removing the dummy gate to exposed the dummy oxide layer;
    removing the dummy oxide layer and a portion of the first insulating layer, thereby forming a reversed T-shape void defined by the first and second insulating layers; and
    forming conductive material in the reversed T-shape void, thereby forming a reversed T-shape gate.

16. The method of claim 15, wherein a top surface of the first insulating layer is substantially co-planar with a top surface of the raised fin.

17. The method of claim 15, wherein after the dummy oxide layer and the portion of the first insulating layer are removed, sidewalls of the raised fin are at least partially exposed.

18. The method of claim 15, wherein after the dummy oxide layer and the portion of the first insulating layer are removed, a bottom surface of the second dielectric layer is partially exposed.

19. The method of claim 15, wherein the conductive material is formed by depositing the conductive material and polishing the deposited conductive material.

20. The method of claim 15, further comprising forming a high-K dielectric material over the raised fin after the dummy oxide layer is removed and before the conductive material is formed.

* * * * *